United States Patent
Campbell et al.

(10) Patent No.: US 8,964,391 B2
(45) Date of Patent: Feb. 24, 2015

(54) SECTIONED MANIFOLDS FACILITATING PUMPED IMMERSION-COOLING OF ELECTRONIC COMPONENTS

(71) Applicant: International Business Machines Corporation, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 13/788,919

(22) Filed: Mar. 7, 2013

(65) Prior Publication Data
US 2014/0123493 A1    May 8, 2014

Related U.S. Application Data

(63) Continuation of application No. 13/671,802, filed on Nov. 8, 2012.

(51) Int. Cl.
*H05K 7/20* (2006.01)
*F28D 15/00* (2006.01)
(Continued)

(52) U.S. Cl.
CPC .......... *F28D 15/00* (2013.01); *F28F 27/00* (2013.01); *F28F 9/00* (2013.01); *B23P 15/26* (2013.01); *H05K 7/20809* (2013.01)

USPC ............. 361/700; 361/679.53; 62/259.2

(58) Field of Classification Search
USPC ............. 361/676–678, 679.46–679.54, 361/688–722, 752, 760, 831
See application file for complete search history.

(56) References Cited

U.S. PATENT DOCUMENTS

| 4,128,123 | A | 12/1978 | Garriss et al. |
| 5,257,660 | A | 11/1993 | Cargile |

(Continued)

OTHER PUBLICATIONS

Campbell et al., "Sectioned Manifolds Facilitating Pumped Immersion-Cooling of Electronic Components", U.S. Appl. No. 13/671,802, filed Nov. 8, 2012.

*Primary Examiner* — Courtney Smith
(74) *Attorney, Agent, or Firm* — Steven Chiu, Esq.; Kevin P. Radigan, Esq.; Heslin Rothenberg Farley & Mesiti P.C.

(57) ABSTRACT

Cooling methods are provided for facilitating pumped immersion-cooling of electronic components. The cooling method includes: providing a housing forming a compartment about one or more components, and providing a supply manifold, a return manifold, and coupling a coolant loop coupling in fluid communication the supply and return manifolds and the housing. Coolant flowing through the coolant loop flows through the compartment of the housing and, at least partially, immersion-cools the component(s) by flow boiling. A pump facilitates circulation of coolant within the loop, and a coolant bypass line is coupled between the supply and return manifolds. The return manifold includes a mixed-phase manifold section, and the bypass line provides coolant from the supply manifold directly to the mixed-phase manifold section. Coolant flows from the coolant bypass line into the mixed-phase manifold section in a direction counter to the direction of any coolant vapor flow within that manifold section.

10 Claims, 10 Drawing Sheets

(51) Int. Cl.
*F28F 27/00* (2006.01)
*F28F 9/00* (2006.01)
*B23P 15/26* (2006.01)

(56) References Cited

U.S. PATENT DOCUMENTS

| | | |
|---|---|---|
| 5,692,389 A | 12/1997 | Lord et al. |
| 6,032,470 A | 3/2000 | Haselden |
| 6,038,875 A | 3/2000 | Haselden |
| 6,230,517 B1 | 5/2001 | Ishiguro et al. |
| 7,493,775 B2 | 2/2009 | Shimamoto et al. |
| 7,507,274 B2 | 3/2009 | Tonkovich et al. |
| 8,351,206 B2 * | 1/2013 | Campbell et al. ............. 361/700 |
| 2004/0112585 A1* | 6/2004 | Goodson et al. .............. 165/299 |
| 2005/0115257 A1* | 6/2005 | Goth et al. ...................... 62/186 |
| 2008/0066889 A1 | 3/2008 | Knight et al. |
| 2008/0123297 A1 | 5/2008 | Tilton et al. |
| 2011/0069453 A1* | 3/2011 | Campbell et al. ............. 361/700 |
| 2011/0315353 A1 | 12/2011 | Campbell et al. |

* cited by examiner

SECTIONED MANIFOLDS FACILITATING PUMPED IMMERSION-COOLING OF ELECTRONIC COMPONENTS

CROSS-REFERENCE TO RELATED APPLICATION

This application is a continuation of U.S. Ser. No. 13/671,802, filed Nov. 8, 2012, and entitled "Sectioned Manifolds Facilitating Pumped Immersion-cooling of Electronic Components", and which is hereby incorporated herein by reference in its entirety.

BACKGROUND

The power dissipation of integrated circuit chips, and the modules containing the chips, continues to increase in order to achieve increases in processor performance. This trend poses cooling challenges at the module and system levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the capability of the room air-conditioning to effectively handle the load. This is especially true for large installations with "server farms" or large banks of computer racks located close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

The shortcomings of the prior art are overcome and additional advantages are provided through a method, which includes: providing a housing at least partially surrounding and forming a compartment about one or more electronic components; providing a supply manifold and a return manifold; coupling a coolant loop in fluid communication with the supply manifold, the compartment of the housing, and the return manifold, wherein a coolant flowing through the coolant loop flows through the compartment of the housing and at least partially immersion-cools the one or more electronic components by, at least in part, flow boiling; coupling a pump in fluid communication with the coolant loop to facilitate circulation of the coolant within the coolant loop between the supply manifold, the compartment of the housing, and the return manifold; and coupling a coolant bypass line in fluid communication between the supply manifold and the return manifold, wherein the return manifold comprises a mixed-phase manifold section receiving coolant from the compartment of the housing and the coolant bypass line provides coolant from the supply manifold directly to the mixed-phase manifold section of the return manifold, and wherein coolant flows from the coolant bypass line into the mixed-phase manifold section of the return manifold in a direction counter to a direction of any coolant vapor flow within the mixed-phase manifold section, the coolant flow from the coolant bypass line facilitating cooling of the coolant vapor flow.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
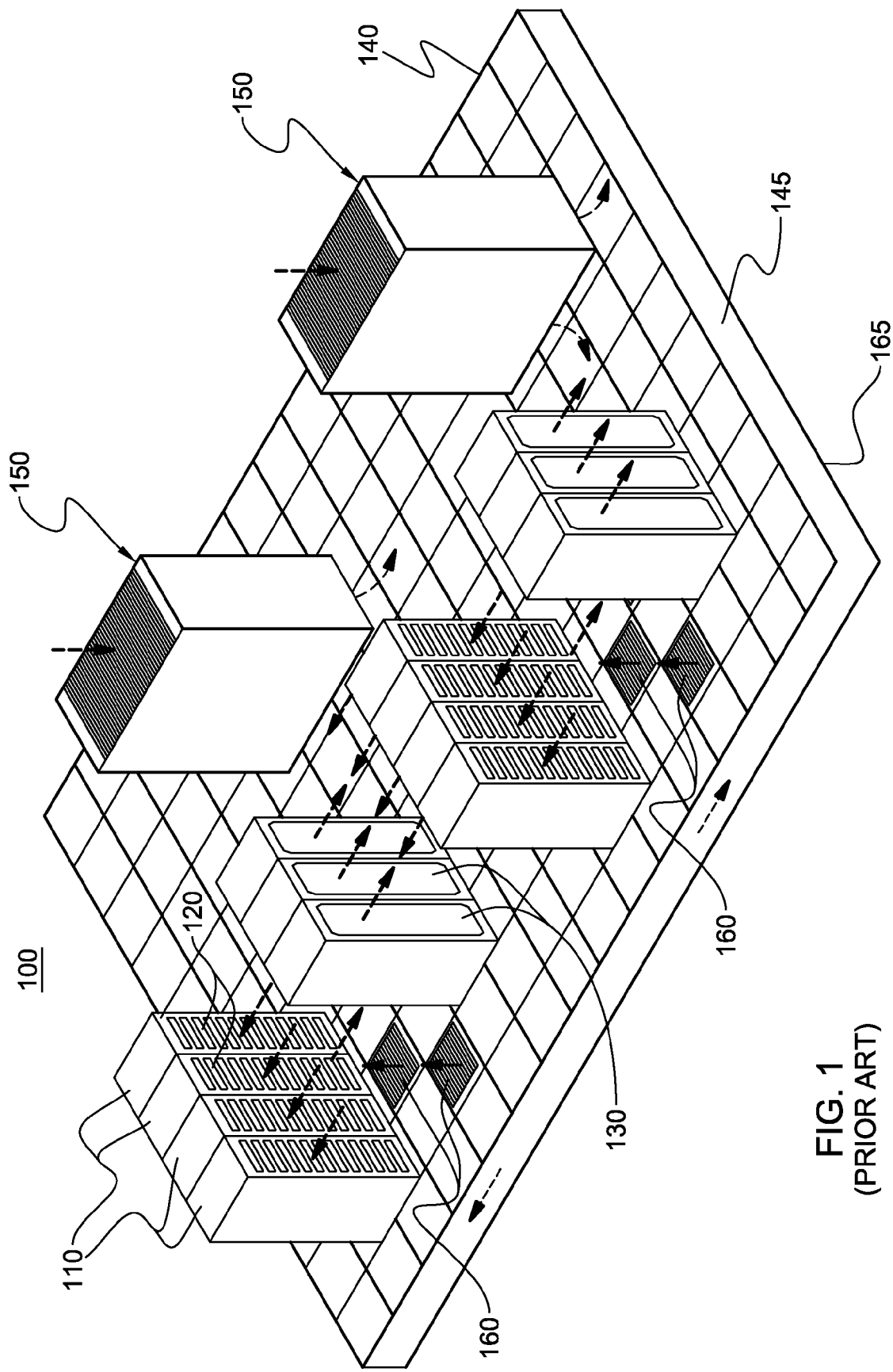
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system, electronic system, or information technology equipment, and may be, for example, a stand alone computer processor having high-, mid- or low-end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed, relative to the electronics rack, with rack-mounted electronic drawers and blades of a blade center system being two examples of electronic systems (or subsystems) of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies or memory support dies. As a further example, an electronic component may comprise one or more bare dies or one or more packaged dies disposed on a common carrier. Further, unless otherwise specified herein, the terms "liquid-cooled cold plate", "liquid-cooled base plate", or "liquid-cooled structure" each refer to any conventional thermally conductive structure having a plurality of channels or passageways formed therein for flowing of liquid-coolant therethrough.

As used herein, a "heat exchanger" may comprise, for example, one or two or more coolant flow paths, formed of thermally conductive tubing (such as copper or other tubing) in thermal or mechanical contact with each other, or in thermal or mechanical contact with a plurality of thermally conductive fins in the case of a condensing heat exchanger. Size, configuration and construction of the heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or a refrigerant, while still maintaining the advantages and unique features of the present invention.

Reference is made below to the drawings, which are not drawn to scale for ease of understanding of the various aspects of the present invention, wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the backs, i.e., air outlet sides 130, of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
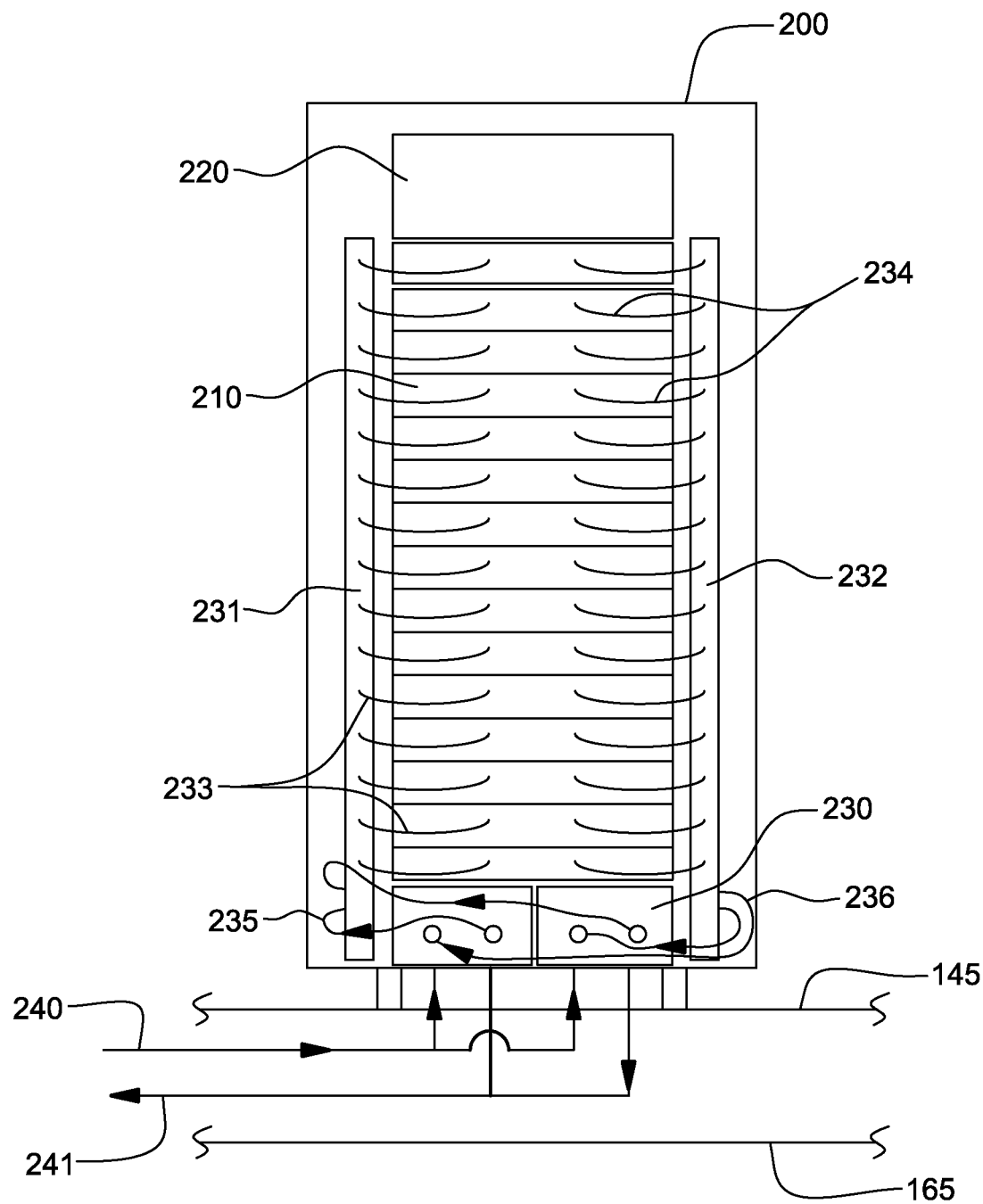
FIG. 2 is a front elevational view of one embodiment of a liquid-cooled electronics rack comprising multiple electronic systems to be cooled via a cooling apparatus, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic systems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic systems. In the embodiments described herein, the system coolant is assumed to be water or an aqueous-based solution, by way of example only.

In addition to MCUs 230, the cooling apparatus depicted includes a system coolant supply manifold 231, a system coolant return manifold 232, and manifold-to-node fluid connect hoses 233 coupling system coolant supply manifold 231 to electronic subsystems 210 (for example, to cold plates or liquid-cooled vapor condensers (see FIGS. 6A-6B) disposed within the systems) and node-to-manifold fluid connect hoses 234 coupling the individual electronic systems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic systems 210 is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
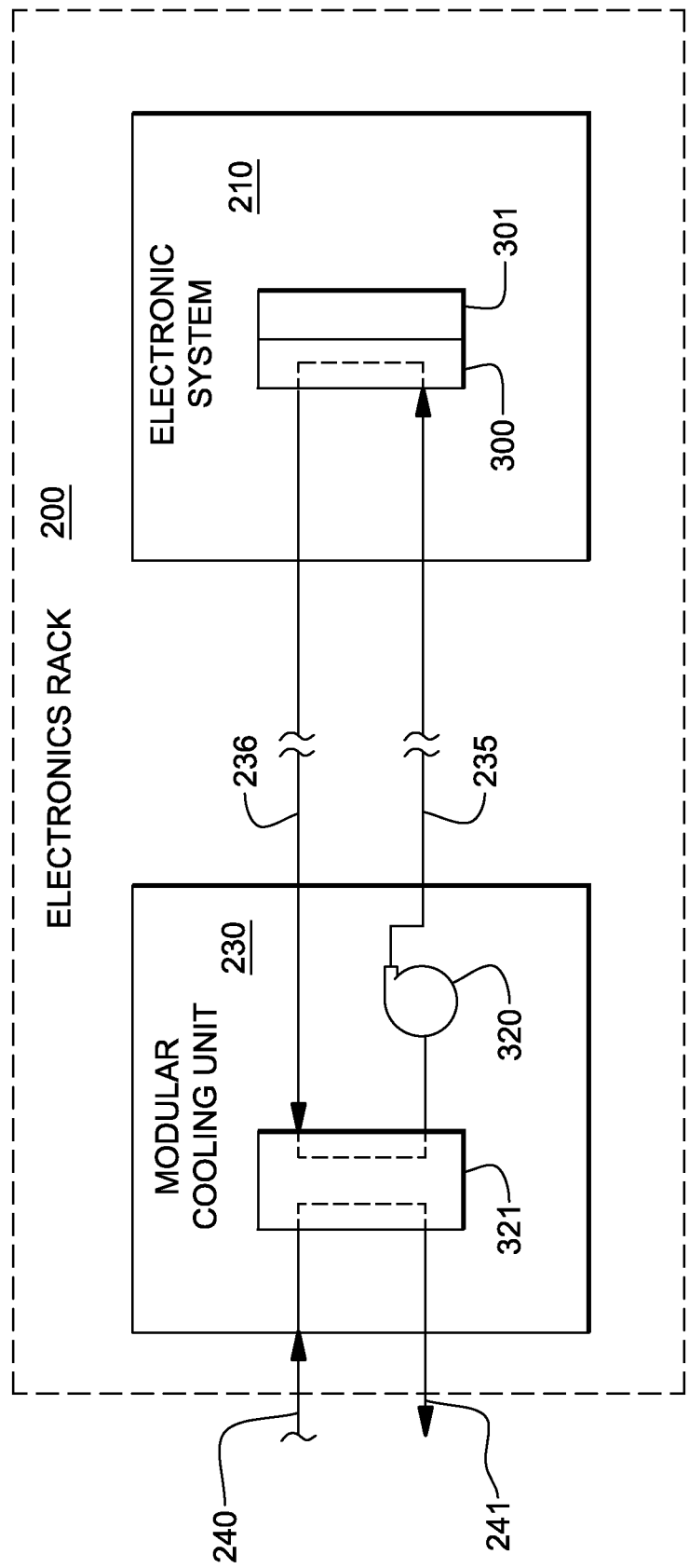
FIG. 3 is a schematic of an electronic system of an electronics rack and one approach to liquid-cooling of an electronic component with the electronic system, wherein the electronic component is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic system 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic systems. Furthermore, the system coolant is physically separate from the less controlled facility coolant in lines 240, 241, to which heat is ultimately transferred.

Figure 4:
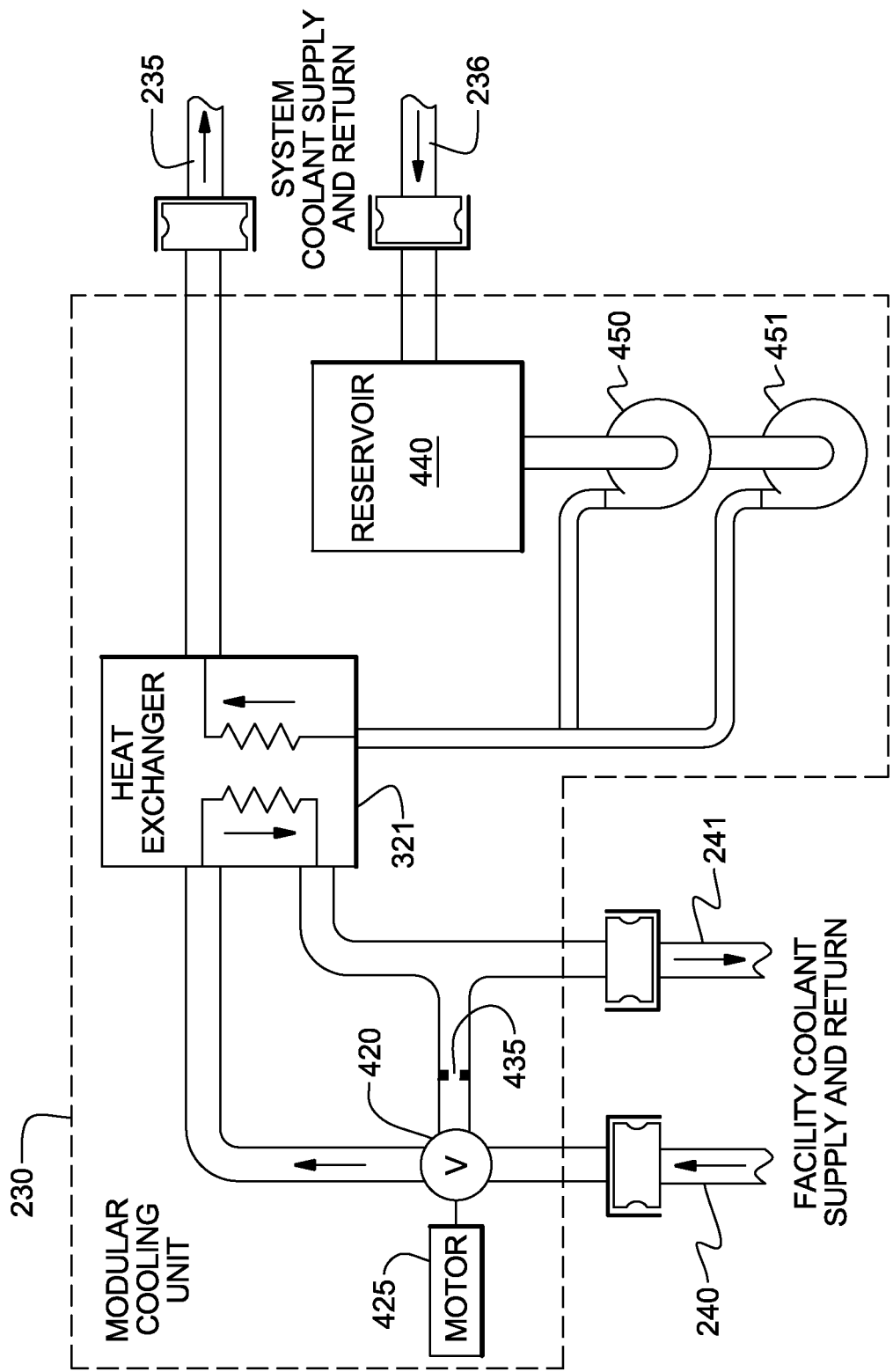
FIG. 4 is a schematic of one embodiment of a modular cooling unit for a liquid-cooled electronics rack such as illustrated in FIG. 2, in accordance with one or more aspects of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
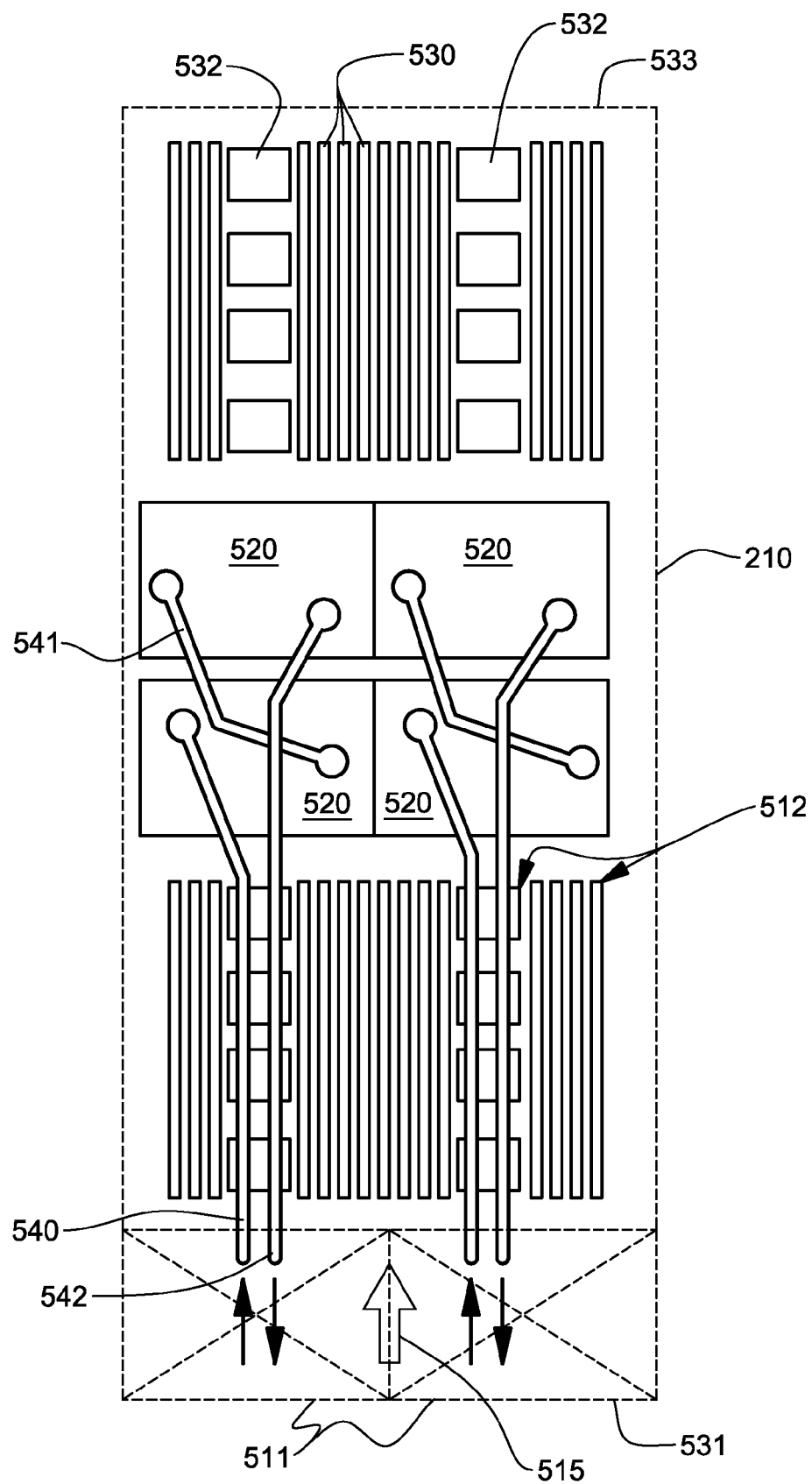
FIG. 5 is a plan view of one embodiment of an electronic system layout illustrating an air and liquid-cooling approach for cooling electronic components of the electronic system, in accordance with one or more aspects of the present invention.

FIG. 5 depicts another cooling approach, illustrating one embodiment of an electronic system 210 component layout wherein one or more air moving devices 511 provide forced air flow 515 in normal operating mode to cool multiple electronic components 512 within electronic system 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic system 210, and partially arrayed near back 533 of electronic system 210. Also, in the embodiment of FIG. 5, memory modules 530 and the memory support modules 532 are cooled by air flow 515 across the electronics system.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

As computing demands continue to increase, heat dissipation requirements of electronic components, such as microprocessors and memory modules, are also rising. This has motivated the development of the application of single-phase, liquid-cooling solutions such as described above. Single-phase, liquid-cooling, however, has some issues. Sensible heating of the liquid as it flows along the cooling channels and across components connected in series results in a temperature gradient. To maintain a more uniform temperature across the heat-generating component, the temperature change in the liquid needs to be minimized. This requires the liquid to be pumped at higher flow rates, consuming more pump power, and thus leading to a less efficient system. Further, it is becoming increasingly challenging to cool all the heat sources on a server or electronic system using liquid-cooled structures alone, due to the density and number of components, such as controller chips, I/O components and memory modules. The small spaces and number of components to be cooled make liquid plumbing a complex design and fabrication problem and significantly raises the overall cost of the cooling solution.

Immersion-cooling is one possible solution to these issues. In immersion-cooling, the components to be cooled are immersed in a dielectric fluid that dissipates heat through boiling. The vapor is then condensed by a secondary, rack-level working (or system) fluid, using (in one embodiment) node or module-level, finned condensers, as explained below.

Direct immersion-cooling of electronic components of an electronic system of the rack unit using dielectric fluid (e.g., a liquid dielectric coolant) advantageously avoids forced air cooling and enables total liquid-cooling of the electronics rack within the data center. Although indirect liquid-cooling, such as described above in connection with FIGS. 3 and 5, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature would enable data center cooling architectures which do not require energy intensive refrigeration chillers. Yet other practical advantages, such as the ability to ship a coolant filled electronic subsystem, may offer benefit over water-cooled approaches such as depicted in FIGS. 3 & 5, which require shipping dry and the use of a fill and drain protocol to insure against freeze damage during transport. Also, the use of liquid immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water based cooling approach. For at least these potential benefits, dielectric fluid immersion-cooling of one or more electronic systems of an electronics rack may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 6A:
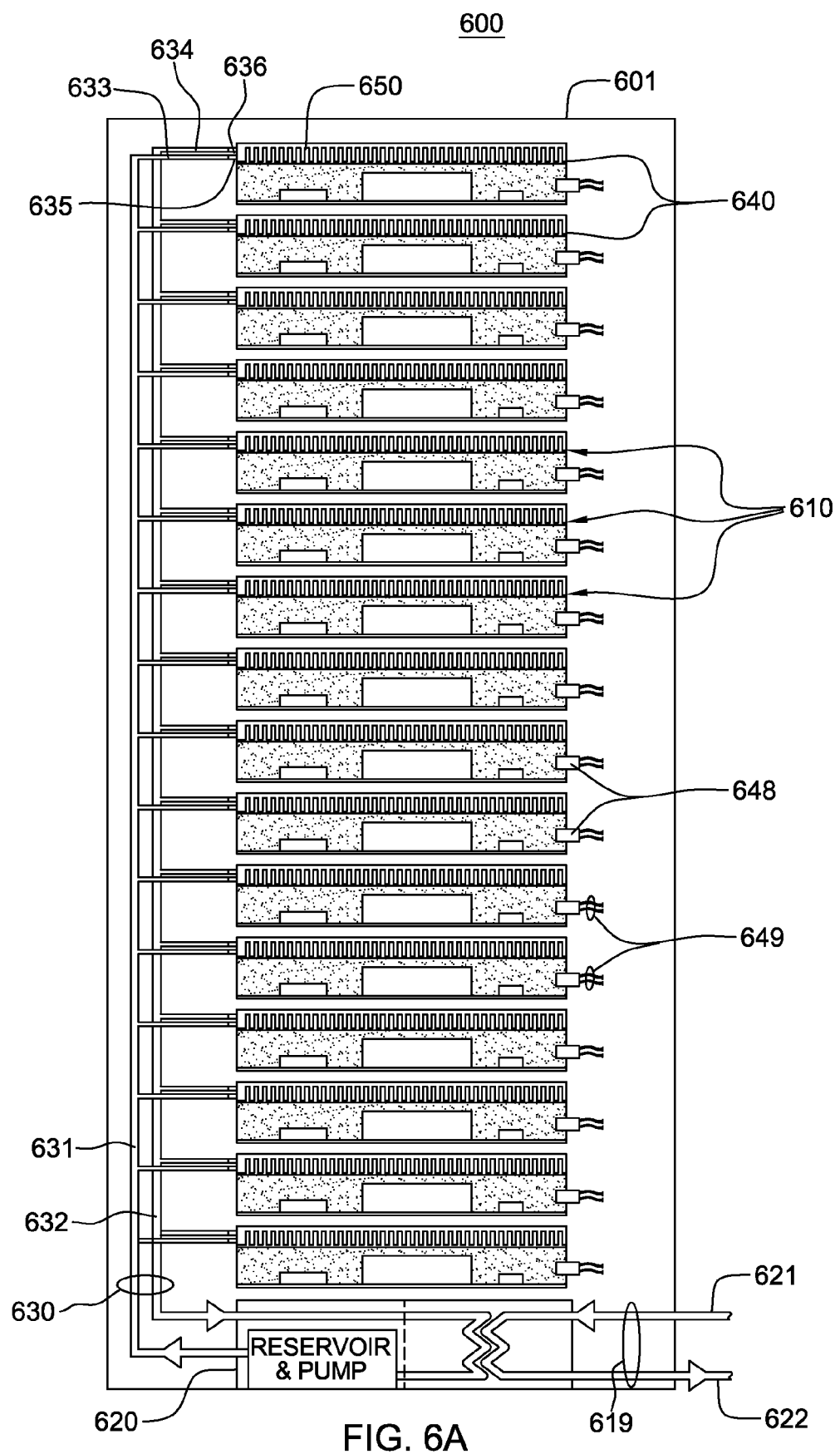
FIG. 6A is an elevational view of an alternate embodiment of a liquid-cooled electronics rack with immersion-cooling of electronic systems thereof, in accordance with one or more aspects of the present invention.

FIG. 6A is a schematic of one embodiment of a liquid-cooled electronics rack, generally denoted 600, employing immersion-cooling of electronic systems, in accordance with an aspect of the present invention. As shown, liquid-cooled electronics rack 600 includes an electronics rack 601 containing a plurality of electronic systems 610 disposed, in the illustrated embodiment, horizontally so as to be stacked within the rack. By way of example, each electronic system 610 may be a server unit of a rack-mounted plurality of server units. In addition, each electronic system includes multiple electronic components to be cooled, which in one embodiment, comprise multiple different types of electronic components having different heights and/or shapes within the electronic system.

The cooling apparatus is shown to include one or more modular cooling units (MCU) 620 disposed, by way of example, in a lower portion of electronics rack 601. Each modular cooling unit 620 may be similar to the modular cooling unit depicted in FIG. 4, and described above. The modular cooling unit includes, for example, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. As one example, facility coolant supply and return lines 621, 622 couple modular cooling unit 620 to a data center facility coolant supply and return (not shown). Modular cooling unit 620 further includes an appropriately sized reservoir, pump and optional filter for moving liquid-coolant under pressure through system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated rigid tube vertically mounted to the electronics rack 601 or to a door of the electronics rack.

In the embodiment illustrated, coolant supply manifold 631 and coolant return manifold 632 are in fluid communication with respective coolant inlets 635 and coolant outlets 636 of individual sealed housings 640 containing the electronic systems 610. Fluid communication between the manifolds and the sealed housings is established, for example, via appropriately sized, flexible hoses 633, 634. In one embodiment, each coolant inlet 635 and coolant outlet 636 of a sealed housing is coupled to a respective liquid-cooled vapor condenser 650 disposed within the sealed housing 640. Heat removed from the electronic system 610 via the respective liquid-cooled vapor condenser 650 is transferred from the system coolant via the coolant return manifold 632 and modular cooling unit 620 to facility coolant loop 619. In one example, coolant passing through system coolant loop 630, and hence, coolant passing through the respective liquid-cooled vapor condensers 650 is water.

Note that, in general, fluidic coupling between the electronic subsystems and coolant manifolds, as well as between the manifolds and the modular cooling unit(s) can be established using suitable hoses, hose barb fittings and quick disconnect couplers. In the example illustrated, the vertically-oriented coolant supply and return manifolds 631, 632 each include ports which facilitate fluid connection of the respective coolant inlets and outlets 635, 636 of the housings (containing the electronic subsystems) to the manifolds via the flexible hoses 633, 634. Respective quick connect couplings may be employed to couple the flexible hoses to the coolant inlets and coolant outlets of the sealed housings to allow for, for example, removal of a housing and electronic subsystem from the electronics rack. The quick connect couplings may be any one of various types of commercial available couplings, such as those available from Colder Products Co. of St. Paul, Minn., USA or Parker Hannifin of Cleveland, Ohio, USA.

One or more hermetically sealed electrical connectors 648 may also be provided in each sealed housing 640, for example, at a back surface thereof, for docking into a corresponding electrical plane of the electronics rack in order to provide electrical and network connections 649 to the electronic system disposed within the sealed housing when the electronic system is operatively positioned within the sealed housing and the sealed housing is operatively positioned within the electronics rack.

Figure 6B:
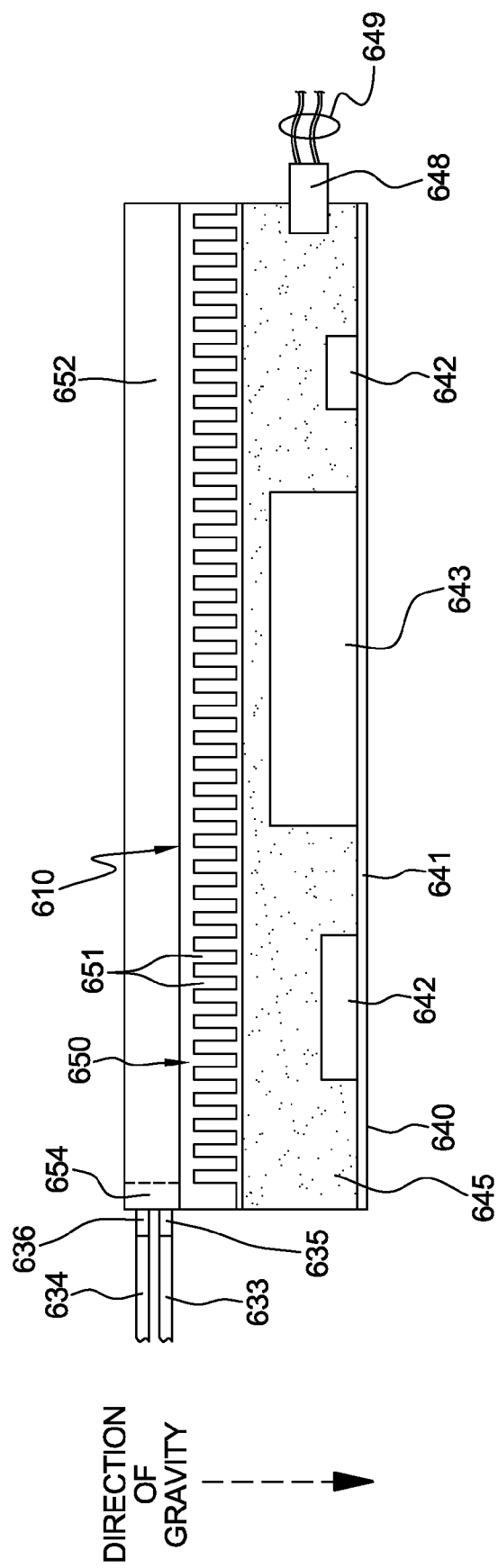
FIG. 6B is a cross-sectional elevational view of one immersion-cooled electronic system of the liquid-cooled electronics rack of FIG. 6A, in accordance with one or more aspects of the present invention.

As illustrated in FIG. 6B, electronic system 610 comprises a plurality of electronic components 642, 643 of different height and type on a substrate 641, and is shown within sealed housing 640 with the plurality of electronic components 642, 643 immersed within a dielectric fluid 645. Sealed housing 640 is configured to at least partially surround and form a sealed compartment about the electronic system with the plurality of electronic components 642, 643 disposed within the sealed compartment. In an operational state, dielectric fluid 645 pools in the liquid state at the bottom of the sealed compartment and is of sufficient volume to submerge the electronic components 642, 643. The electronic components 642, 643 dissipate varying amounts of power, which cause the dielectric fluid to boil, releasing dielectric fluid vapor, which rises to the upper portion of the sealed compartment of the housing.

The upper portion of sealed housing 640 is shown in FIG. 6B to include liquid-cooled vapor condenser 650. Liquid-cooled vapor condenser 650 is a thermally conductive structure which includes a liquid-cooled base plate 652, and a plurality of thermally conductive condenser fins 651 extending therefrom in the upper portion of the sealed compartment. A plenum structure 654 comprises part of liquid-cooled base plate 652, and facilitates passage of system coolant through one or more channels in the liquid-cooled base plate 652. In operation, the dielectric fluid vapor contacts the cool surfaces of the thermally conductive condenser fins and condenses back to liquid phase, dropping downwards towards the bottom of the sealed compartment.

System coolant supplied to the coolant inlet of the housing passes through the liquid-cooled base plate of the liquid-cooled vapor condenser and cools the solid material of the condenser such that condenser fin surfaces that are exposed within the sealed compartment to the dielectric fluid vapor (or the dielectric fluid itself) are well below saturation temperature of the vapor. Thus, vapor in contact with the cooler condenser fin surfaces will reject heat to these surfaces and condense back to liquid form. Based on operating conditions of the liquid-cooled vapor condenser 650, the condensed liquid may be close in temperature to the vapor temperature or could be sub-cooled to a much lower temperature.

As a variation on the immersion-cooling approach of FIGS. 6A & 6B, one or more components of an electronic system or subsystem may be at least partially immersion-cooled using pumped dielectric coolant. In one embodiment, a housing or enclosure may be provided at least partially surrounding and forming a compartment about the one or more electronic components to be immersion-cooled. Coupled to the housing is a coolant loop which provides pumped dielectric coolant flow through the compartment of the housing. This pumped dielectric fluid at least partially immersion-cools the one or more components within the housing, and in one embodiment, heat transfer is facilitated by, at least in part, flow boiling of the pumped dielectric coolant. In such an implementation, dielectric coolant vapor exits the compartment, or a mixture of dielectric coolant vapor and liquid exits the compartment. When utilizing boiling of dielectric fluid to facilitate electronic component cooling, a condenser may be employed, located within the housing, or remote from the housing. In either case, physical space is required for the coolant vapor to be condensed before it can be returned to the housing for further cooling of the components. When electronic systems or subsystems, such as servers, are packaged within an electronics rack, it is advantageous to make the electronics housing (or enclosure) as compact as possible, and to avoid using space between the system mounting rails for separate cooling units, such as the above-described modular cooling units. Advantageously, disclosed herein is a cooling apparatus which utilizes volume within the electronics rack typically reserved for the manifolds of a liquid-cooled rack, such as illustrated in FIG. 2 and described above, without impacting the central area of the electronics rack reserved for mounting of electronic systems (such as servers, nodes, etc.).

Generally stated, disclosed herein in one implementation is a cooling apparatus comprising a multi-sectioned supply manifold and a multi-sectioned return manifold. One or more housings are provided at least partially surrounding and forming one or more compartments about one or more respective electronic components. In one example, multiple housings are provided associated with multiple electronic systems or subsystems (e.g., servers) of, for instance, an electronics rack. A closed coolant loop couples in fluid communication the supply manifold, the compartment(s) of the housing(s), and the return manifold, wherein dielectric coolant flowing through the coolant loop flows through the compartment(s) of the housing(s) and at least partially immersion-cools the one or more respective electronic components by, at least in part, flow boiling. A pump facilitates circulation of the coolant within the coolant loop between the supply manifold, the compartment(s) of the housing(s), the return manifold, and back to the supply manifold. A coolant bypass line is coupled in fluid communication between the supply manifold and the return manifold, and the return manifold includes a mixed-phase manifold section which receives coolant (e.g., coolant vapor or a mixed-phase coolant vapor and liquid from the compartment(s) of the housing(s)). The coolant bypass line provides cooled coolant from the supply manifold directly to the mixed-phase manifold section of the return manifold, and the cooled coolant flows from the coolant bypass line into the mixed-phase manifold section of the return manifold in a direction counter to a direction of any coolant vapor flow within the mixed-phase manifold section. The coolant flow from the coolant bypass line facilitates condensing of the coolant vapor flow within the mixed-phase manifold section.

By way of further detail, the return manifold may include a heat exchanger section coupled to allow coolant vapor to pass from the mixed-phase manifold section into the heat exchanger section. The heat exchanger section facilitates condensing of the coolant vapor. In one embodiment, the coolant loop separately couples in fluid communication to a lower region of the mixed-phase manifold section of the return manifold and to a lower region of the heat exchanger section of the return manifold, and the coolant pump is disposed to drain liquid coolant from the mixed-phase manifold section of the return manifold and from the heat exchanger section of the return manifold. In one implementation, the mixed-phase manifold section and the heat exchanger section are coupled for vapor communication in an upper region of the sections. As a further enhancement, a separator valve may be provided configured and disposed to allow liquid coolant to be drained from the mixed-phase manifold section towards the pump and inhibit drawing of coolant vapor from the mixed-phase manifold section towards the pump. In one implementation, the mixed-phase manifold section is vertically oriented, and the coolant flows from the coolant bypass line into the mixed-phase manifold section in a direction of gravity. In this implementation, the coolant vapor flow in the mixed-phase manifold section is buoyancy-driven in a direction opposite to the direction of gravity.

The heat exchange section includes, in one implementation, a vertically-oriented heat exchanger with a secondary coolant passing therethrough. The vertically-oriented heat exchanger facilitates condensing of coolant vapor from the mixed-phase manifold section of the return manifold, and the secondary coolant may comprise, in one example, water. In a further implementation, the return manifold may include one or more spray nozzle(s) coupled to receive coolant from the coolant bypass line. In one embodiment, the spray nozzle(s) sprays cooled coolant from the coolant bypass line into the mixed-phase manifold section to facilitate condensing of the coolant vapor flow.

As explained further below, the supply manifold may include, in one embodiment, a sub-cooling heat exchange section, wherein coolant is pumped by the pump through the coolant loop into the sub-cooling heat exchange section for further cooling of the coolant below the coolant's saturation temperature. The supply manifold may also include a coolant supply manifold section that is coupled, for example, in the upper region thereof in fluid communication with the sub-cooling heat exchange section. The coolant supply manifold section facilitates distribution of sub-cooled coolant to the housing(s) via a respective coolant loop portion(s). The sub-cooling heat exchange section and the coolant supply manifold section of the supply manifold are, in one embodiment, separate, vertically-oriented manifold sections that, as noted, are coupled in fluid communication at upper regions thereof. The pump moves coolant from the coolant loop into a lower region of the sub-cooling heat exchange section of the supply manifold, and from there upwards and into the coolant supply manifold section of the supply manifold for distribution to the one or more housings of the cooling apparatus.

More particularly, in one embodiment, a multi-sectioned, vertical return manifold is provided for efficient condensing of two-phase dielectric coolant returned from multiple electronic housings or enclosures of the system. The return manifold may include a liquid and vapor separating structure, which is referred to herein as the mixed-phase manifold section, with a vapor passageway connecting the mixed-phase manifold section to the heat exchanger section of the return manifold, for instance, in the upper regions thereof. A vapor-impeding valve (referred to herein as the separator valve) is provided in a lower region of the mixed-phase manifold section, and connects the liquid coolant return of that section to the one or more pumps of the coolant loop. The supply manifold may also comprise a multi-sectioned, vertically-oriented manifold disposed, for example, within an electronics rack, and configured (in one embodiment) to provide sub-cooling of the coolant and coolant distribution functions.

Figure 7A:
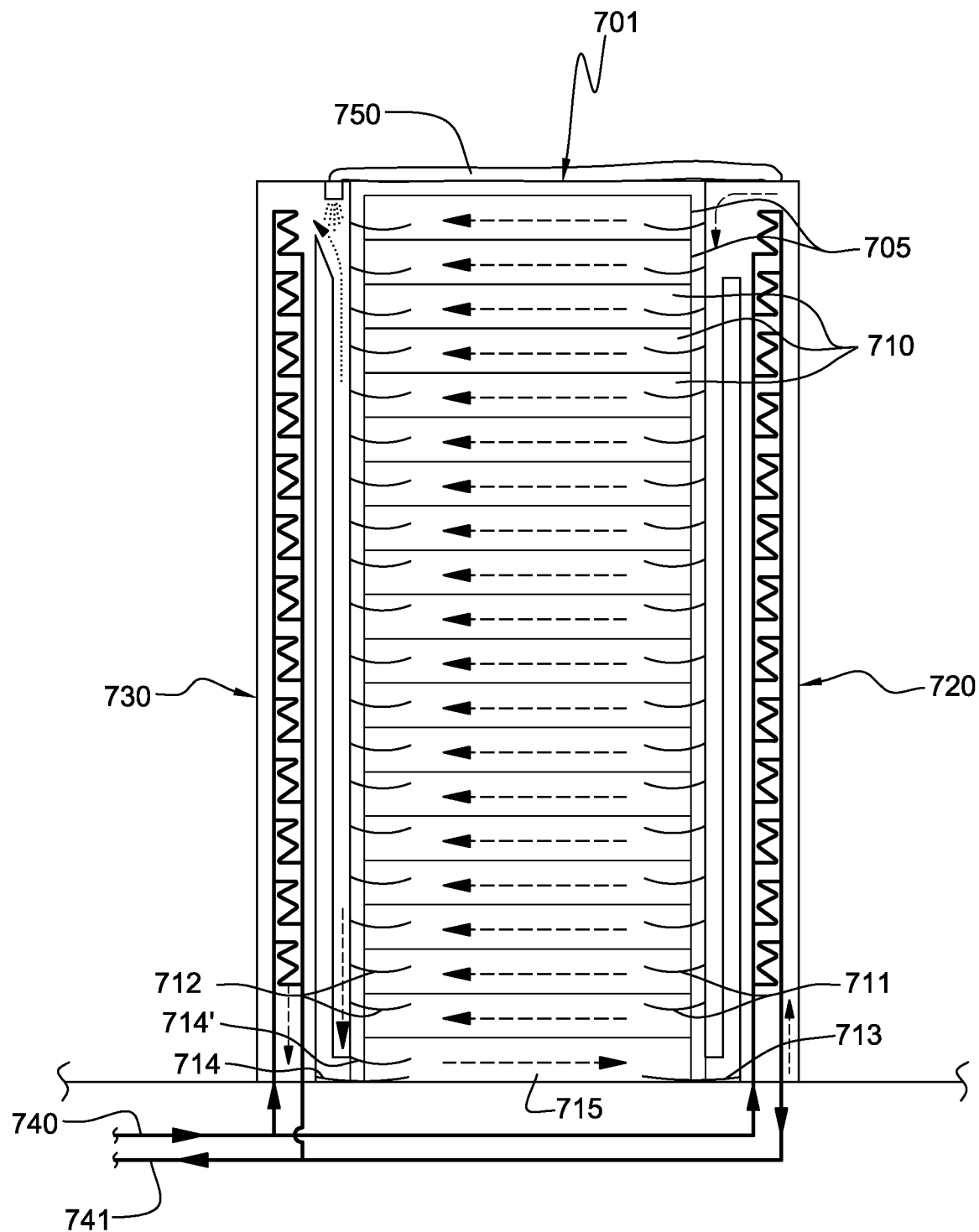
FIG. 7A is an elevational view of another embodiment of an coolant-cooled electronic system comprising a cooling apparatus and multiple electronic systems or subsystems at least partially immersion-cooled by the cooling apparatus, in accordance with one or more aspects of the present invention.

FIG. 7A depicts one embodiment of a coolant-cooled electronic system, in accordance with one or more aspects of the present invention. The coolant-cooled electronic system comprises, in this example, an electronics rack 701 which includes multiple electronic systems (or subsystems, servers, etc.) 710, each of which includes one or more electronic components to be at least partially immersion-cooled by dielectric coolant pumped as described herein. In one example, electronic systems 710 reside within housings or enclosures 705 sized and configured to reside within electronic rack 701, as illustrated. The housings 705 may enclose substantially all or, only a part of, the components of an electronic system 710. Further, a single electronic system may comprise one or multiple housings, each defining a compartment about one or more respective electronic components thereof.

The cooling apparatus further includes a supply manifold 720 and a return manifold 730 which are coupled in fluid communication with the compartments of the housings 705 via respective coolant supply and return lines 711, 712 of a coolant loop, which further includes coolant supply and return lines 713, 714. The coolant loop couples in fluid communication (via a closed loop path) the compartments of housings 705, return manifold 730, one or more pumps 715, and supply manifold 720. One or more pumps 715 are provided to circulate coolant within the coolant loop between the supply manifold 720, housings 705, return manifold 730, and pump(s) 715. A secondary coolant supply line 740 and secondary coolant return line 741 are coupled in fluid communication with respective heat exchange sections of the supply and return manifolds 720, 730 to facilitate extraction of heat from coolant passing through the manifolds, as described below. In one embodiment, the secondary coolant may comprise chilled water, or a chilled, aqueous-based coolant. Note that in an alternate embodiment, the secondary coolant is provided to return manifold 730 only, with no additional sub-cooling of the coolant being provided via a sectioned supply manifold 720, such as described herein. Note also that a coolant bypass line 750 is coupled in fluid communication between the supply manifold 720 and the return manifold 730, and provides cooled coolant from the supply manifold directly to a mixed-phase manifold section of the return manifold for facilitating cooling of any coolant vapor therein, as discussed below.

Figure 7B:
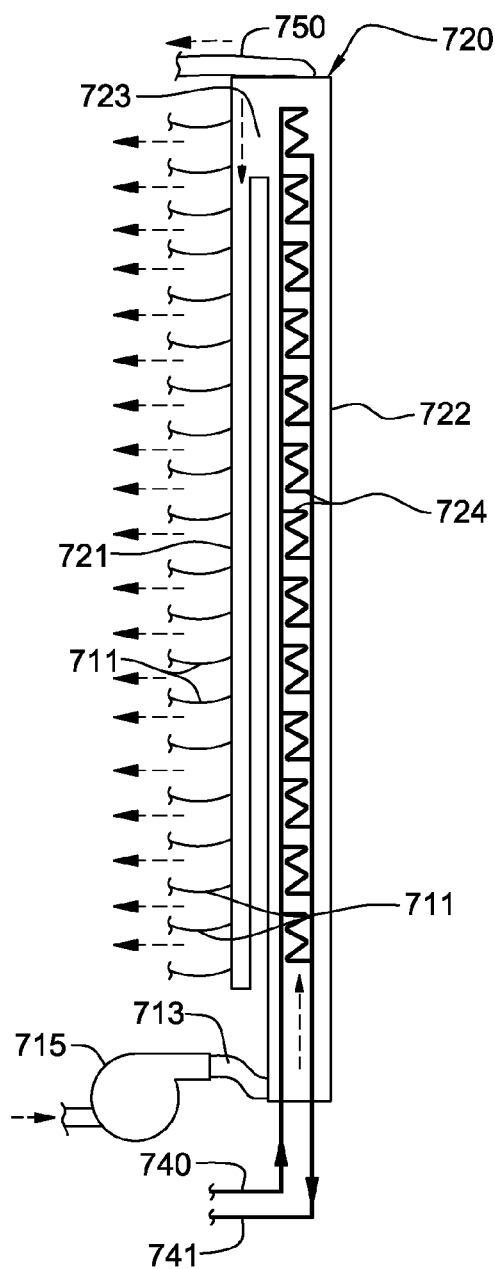
FIG. 7B is an elevational view of one embodiment of the supply manifold of the cooling apparatus of FIG. 7A, in accordance with one or more aspects of the present invention.

FIG. 7B depicts one example of supply manifold 720. In this example, supply manifold 720 is multi-sectioned and includes a coolant supply manifold section 721 and a sub-cooling heat exchange section 722. Coolant supply manifold section 721 and sub-cooling heat exchange section 722 are coupled in fluid communication in an upper region 723 thereof. In this example, sub-cooling heat exchange section 722 includes a vertically-oriented heat exchanger 724 which facilitates sub-cooling of coolant within the sub-cooling heat exchange section 722 by extracting heat from the coolant and transferring the heat to secondary coolant provided to the heat exchanger 724 by secondary coolant supply line 740 and secondary coolant return line 741. Note that the sub-cooling of the coolant may be to a desired temperature below the coolant's saturation temperature. In operation, pump(s) 715 circulates coolant via coolant supply line 713 to a lower region of sub-cooling heat exchange section 722. The coolant flows upwards within sub-cooling heat exchange section 722 and passes over, in an upper region 723 thereof, into coolant supply manifold section 721. From coolant manifold section 721, coolant is distributed via coolant supply lines 711 to the compartments of the housings. Note also that a small percentage of the cooled coolant exits via the coolant bypass line 750 for direct transfer to the return manifold.

Figure 7C:
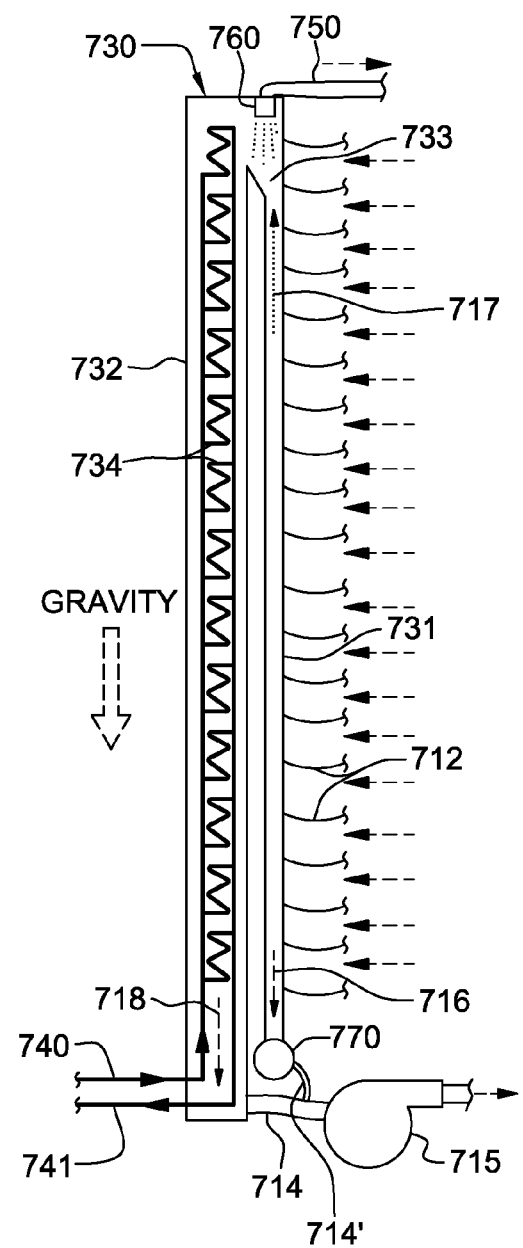
FIG. 7C. is an elevational view of one embodiment of the return manifold of the cooling apparatus of FIG. 7A, in accordance with one or more aspects of the present invention.

FIG. 7C depicts one embodiment of return manifold 730, shown to comprise multiple vertically-oriented sections, including a mixed-phase manifold section 731 and a heat exchanger section 732. Mixed-phase manifold section 731 is coupled in fluid communication with the coolant return lines 712 of the coolant loop, which couples in fluid communication the immersion-cooling enclosures or housings, and the return manifold. The sections of the return manifold 730 are coupled together, in this example, by a coolant vapor passageway 733 disposed in the upper regions of the manifold sections. In operation, the coolant return lines 712 may return liquid coolant, vapor coolant, or a mixture of liquid and vapor coolant, depending on the heat load dissipated within the respective housings. The separate return lines 712 couple in fluid communication to the mixed-phase manifold section 731, where liquid coolant 716 falls in the direction of gravity to a lower region of the section, and vapor coolant 717 rises, in a buoyancy-driven manner, upwards in a direction opposite to that of gravity. At the coolant vapor passageway 733, the vapor is cooled (in one embodiment) by cooled coolant transferred from the coolant supply manifold to the return manifold via the coolant bypass line 750. In one embodiment, this cooled coolant may be sprayed by a coolant nozzle 760 into the coolant vapor passageway 733. From the mixed-phase manifold section, the coolant vapor enters the heat exchanger section 732, which includes, in one implementation, a vertically-oriented, coolant-vapor-to-liquid heat exchanger 734. Heat exchanger 734 includes tubes through which a secondary coolant, such as water, flows. The secondary coolant is received and returned via secondary coolant supply line 740 and secondary coolant return line 741 (in one example). The condensed coolant 718 falls to the lower region of heat exchanger section 732, and flows via coolant return line 714 to pump 715 for recirculation within the closed loop. The condensed liquid is joined with a return line 714 from the mixed-phase manifold section. Associated with this return line, and upwards of the pump 715, a liquid and vapor separator valve 770 prevents vapor from being drawn into the pump inlet from the mixed-phase manifold section 731 from return line 714'.

Figure 8:
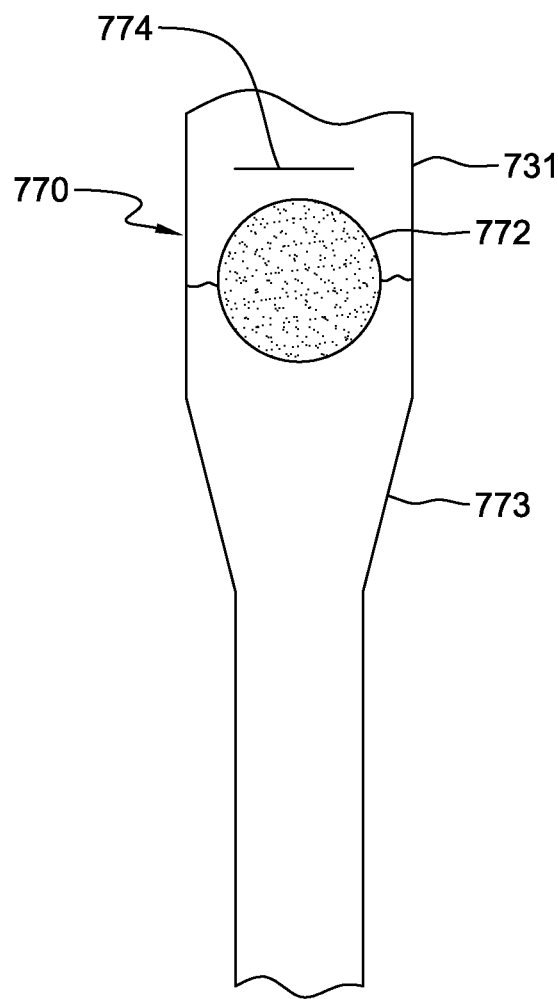
FIG. 8 partially depicts one embodiment of the mixed-phase manifold section of the return manifold depicted in FIG. 7C, and illustrates one embodiment of a separator valve, in accordance with one or more aspects of the present invention.

FIG. 8 depicts one embodiment of a liquid vapor separator valve 770. In this embodiment, the separator valve is shown disposed in a lower region of mixed-phase manifold section 731, and includes a float 772, and a tapered shut-off region 773. Float 772 floats within liquid coolant drained to the lower region of the mixed-phase manifold section, and automatically closes the coolant flow path when the liquid level in that manifold section is too low, which prevents drawing coolant vapor into the pump. The tapered shut-off region and float are sized to accomplish this function. A float retainer structure 774 is also provided to prevent interference with dielectric coolant flowing via the separate coolant return lines 712 into return manifold 730 (see FIG. 7C). Note that the float is constructed such that its weight is less than the weight of the volume of coolant it displaces. The tapered region is a frustum with a perimeter corresponding to the shape of the float, such that as the liquid level decreases and the float position becomes lower, at the limit, the float closes the fluid path such that the vapor cannot be drawn into the pump inlet.

Those skilled in the art will note from the above description that provided herein, in one aspect, is a coolant-cooled electronic system, which may be configured for an electronics rack. The system includes one or more components cooled by flow boiling of dielectric coolant, such as a refrigerant. In operation, the immersion-cooled housings or enclosures receive sub-cooled coolant from a supply manifold, and return (for example) partially vaporized coolant to a return manifold in the closed loop path, which couples the pump, supply manifold, housings, and return manifold.

In one implementation, both the supply and the return manifolds are multi-sectioned, and include both a multiplex section and a heat exchange section. The supply manifold's heat exchange section, referred to herein as the sub-cooling heat exchange section, provides sub-cooled coolant to the housings via a coolant supply manifold section, as well as to a sub-cooled bypass line directly coupled to the return manifold (and thus bypassing the housings).

The return manifold receives, for instance, partially vaporized coolant from the housings, as well as sub-cooled coolant from the bypass line, in a mixed-phase manifold section. The mixed-phase manifold section is oriented with the direction of vapor flow being substantially parallel and opposite to the direction of gravity (that is, buoyancy-driven), and the direction of liquid coolant flow being in the direction of gravity.

Liquid coolant pools in the lower region of the mixed-phase manifold section, and causes the liquid vapor separating valve to float, allowing liquid coolant to return directly to the one or more pumps. If liquid coolant level is too low within the mixed-phase manifold section, the float of the separator valve seals against a taper in the fluid path to prevent coolant vapor from ingressing at the pump.

The coolant vapor travels to the upper region of the mixed-phase manifold section, and enters the heat exchanger section of the return manifold, where the coolant vapor is condensed via a secondary coolant circulating in tubing of the condensing heat exchanger, which removes heat from the coolant vapor, causing it to condense into liquid and drop to the lower region of the heat exchanger section of the return manifold, where it is drawn by the pump for return to the supply manifold.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A method comprising:
   providing a housing at least partially surrounding and forming a compartment about one or more electronic components;
   providing a supply manifold and a return manifold;
   coupling a coolant loop in fluid communication with the supply manifold, the compartment of the housing, and the return manifold, wherein a coolant flowing through the coolant loop flows through the compartment of the housing and at least partially immersion-cools the one or more electronic components by, at least in part, flow boiling;
   coupling a pump in fluid communication with the coolant loop to facilitate circulation of the coolant within the coolant loop between the supply manifold, the compartment of the housing, and the return manifold; and
   coupling a coolant bypass line in fluid communication between the supply manifold and the return manifold, wherein the return manifold comprises a mixed-phase manifold section receiving coolant from the compartment of the housing and the coolant bypass line provides coolant from the supply manifold directly to the mixed-phase manifold section of the return manifold, and wherein coolant flows from the coolant bypass line into the mixed-phase manifold section of the return manifold in a direction counter to a direction of any coolant vapor flow within the mixed-phase manifold section, the coolant flow from the coolant bypass line facilitating cooling of the coolant vapor flow.

2. The method of claim 1, wherein the return manifold further comprises a heat exchanger section coupled to allow coolant vapor to flow from the mixed-phase manifold section into the heat exchanger section, the heat exchanger section facilitating condensing of the coolant vapor.

3. The method of claim 2, wherein the coolant loop separately couples in fluid communication to a lower region of the mixed-phase manifold section and to a lower region of the heat exchanger section, and the pump is disposed to drain coolant from the mixed-phase manifold section of the return manifold and from the heat exchanger section of the return manifold.

4. The method of claim 3, further comprising providing a separator valve configured and disposed to allow liquid coolant to be drawn from the mixed-phase manifold section towards the pump and inhibit drawing of coolant vapor from the mixed-phase manifold section towards the pump.

5. The method of claim 4, wherein the mixed-phase manifold section is vertically-oriented, and coolant flows from the coolant bypass line into the mixed-phase manifold section of the return manifold in a direction of gravity, and the coolant vapor flow in the mixed-phase manifold section is buoyancy-driven, and the direction of the coolant vapor flow in the mixed-phase manifold section is opposite to the direction of gravity.

6. The method of claim 2, wherein the heat exchanger section comprises a vertically-oriented heat exchanger with a secondary coolant passing therethrough, the vertically-oriented heat exchanger facilitating condensing of coolant vapor from the mixed-phase manifold section of the return manifold.

7. The method of claim 2, wherein the supply manifold further comprises a sub-cooling heat exchange section, and wherein coolant is pumped by the pump through the coolant loop into the sub-cooling heat exchange section of the supply manifold for cooling of the coolant below the coolant's saturation temperature.

8. The method of claim 7, wherein the supply manifold further comprises a coolant supply manifold section, the coolant supply manifold section being coupled to the sub-cooling heat exchange section and facilitating distribution of sub-cooled coolant to the housing via the coolant loop.

9. The method of claim 8, wherein the sub-cooling heat exchange section and the coolant supply manifold section of the supply manifold are each vertically oriented and coupled in fluid communication at upper regions thereof, and wherein the pump moves coolant from the coolant loop into a lower region of the sub-cooling heat exchange section of the supply manifold.

10. The method of claim 1, wherein the return manifold further comprises a spray nozzle coupled to receive coolant from the coolant bypass line, the spray nozzle spraying coolant from the coolant bypass line into the mixed-phase manifold section to facilitate cooling of the coolant vapor flow.

* * * * *